United States Patent [19]

Skelly

[11] Patent Number: 5,773,078
[45] Date of Patent: Jun. 30, 1998

[54] METHOD FOR DEPOSITING ZIRCONIUM OXIDE ON A SUBSTRATE

[75] Inventor: David William Skelly, Burnt Hills, N.Y.

[73] Assignee: General Electric Company, Schenectady, N.Y.

[21] Appl. No.: 669,207

[22] Filed: Jun. 24, 1996

[51] Int. Cl.$^6$ .............................. C23C 14/24; B05D 3/06
[52] U.S. Cl. .................. 427/126.3; 427/566; 427/126.2; 427/405; 427/419.2
[58] Field of Search ................................. 427/566, 126.3, 427/405, 126.2, 419.2; 428/469

[56] References Cited

U.S. PATENT DOCUMENTS

| 5,087,477 | 2/1992 | Giggins, Jr. ................................. 427/38 |
| 5,262,245 | 11/1993 | Ulion et al. .............................. 428/469 |
| 5,418,003 | 5/1995 | Bruce et al. . |
| 5,419,971 | 5/1995 | Skelly et al. . |
| 5,474,809 | 12/1995 | Skelly et al. . |
| 5,514,482 | 5/1996 | Strangman .............................. 428/623 |

OTHER PUBLICATIONS

"Thermal Barrier Coatings–their Functional Benefits, Problems and Improvements in Mfg. and Quality" by P. Adam, T. Cosack, Proceedings of the Conf., London, UK, Jun. 16–18, 1993, p. 13.1–13.8.

"Study of the Structure and Properities of Thick Vacuum Condensates of Nickel, Titanium, Tungsten, Aluminum Oxide and Zirconium Dioxide" by B.A. Movchan and A.V. Demchishin, Fiz. Metal. Metalloved., 28, No. 4, pp. 83–90, 1969.

"Microstructural Development in Physical Vapour–deposited Partially Stabilized Zirconia Thermal Barrier Coatings" by Y.H. Sohn, R.R. Biederman and R.D. Sisson, Jr., Thin Solid Films, 250 (1994, pp. 1–7.

"Microstructures of Y2O3–Stabilized ZrO2 Electron Beam––Physical Vapor Deposition Coatings on Ni–Base Superalloys", O. Unal, T.E. Mitchell and A.H. Heuer, J. Am. Ceramic Soc, 77 (4) (1994), pp. 984–992.

"Mass Spectrometric Study of the Incongruent Step in the Evaporation of Lu2O3 and of ZrO2–Y2O3 and ZrO2–Lu2O3 Solid Solutions" by A.N. Belov, S.I. Loptain and G.A. Semenov, Russian Journal of Physical Chemistry 55 (4) 1981, pp. 524–528.

"PVD Thermal Barrier Coating Applications and Process Development for Aircraft Engines" by D.V. Rigney, R. Viguie, D.J. Wortman and D.W. Skelly, pp. 135–149 NASA Workshop, Mar. 1995.

*Primary Examiner*—Roy V. King
*Attorney, Agent, or Firm*—Noreen C. Johnson; Douglas E. Stoner

[57] ABSTRACT

An improved method for depositing zirconium oxide from a zirconium oxide source onto a substrate by means of physical vapor deposition is described. The method includes the step of adding zirconium metal to the zirconium oxide source, which is usually in the form of a cylindrical ingot. The zirconium metal is present in an amount sufficient to chemically bond with a substantial portion of oxygen which would otherwise be freed from the oxide source, as both the zirconium metal and the zirconium oxide source are evaporated during physical vapor deposition. The invention is especially suited for EB-PVD techniques, in which an electron beam is used to evaporate the zirconium metal and the zirconium oxide source during physical vapor deposition. In one embodiment, the zirconium metal comprises a tube which surrounds and contacts at least a portion of the outer surface of the ingot. In another embodiment, the zirconium metal is in the form of a rod inserted in a cavity within the ingot.

20 Claims, 3 Drawing Sheets

METHOD FOR DEPOSITING ZIRCONIUM OXIDE ON A SUBSTRATE

FIELD OF THE INVENTION

The present invention relates generally to coatings technology, and more specifically, to improved techniques for applying zirconium oxide coatings to various metal substrates.

BACKGROUND OF THE INVENTION

Specialized coatings are sometimes used to protect metal parts which are exposed to high temperatures. Aircraft engines provide one example of the use of these coatings. A mixture of fuel and compressed air is burned in these engines, and the resulting hot exhaust gasses cause a turbine to rotate. The gasses then flow from the back of the engine, causing the aircraft to move in a forward direction.

Maintaining the exhaust gas temperature as high as possible improves the efficiency of the jet engine. However, the maximum gas temperature is usually limited by the materials used to fabricate the engine components, e.g., the turbine blades. Currently, such components are usually made of alloys which are resistant to high temperature-environments. These materials, sometimes referred to as "superalloys", have an operating temperature limit of about 1000° C.–1100° C. Operation above these temperatures may cause the components to fail and damage the engine.

A variety of approaches have been used to raise the operating temperature limit for these types of metal parts. The composition and processing techniques for preparing the alloys have been considerably improved. Moreover, physical cooling techniques have also been devised. For example, techniques have also been devised. For example, aircraft engine components have been provided with internal cooling channels through which cool air is forced during engine operation.

Thermal barrier coating (TBC) systems have been devised to further increase the operating temperature of the alloys. These coatings are applied to the surface of turbine blades and vanes, and they include a ceramic barrier coating which insulates the component from the hot exhaust gasses, thereby permitting higher exhaust temperatures. A variety of heat-insulating materials may be used as the barrier coating. Zirconia-based materials are often selected. TBC systems frequently also include a bond coat which is placed between the barrier coating and the substrate to improve adhesion.

Methods for depositing ceramic barrier coatings like zirconia (zirconium oxide) are known in the art. One very attractive technique is based on physical vapor deposition (PVD). In one type of PVD, an ingot of the material being deposited is placed in a chamber which is then evacuated. The top end of the ingot is then heated by an intense heat source (from an electron beam or laser, for example), so that it melts and forms a molten pool. A portion of the very hot, molten ceramic evaporates and deposits (condenses) on a substrate positioned above the pool. In this manner, a coating is gradually built up on the substrate, as the ingot is moved upwardly to be melted and replenish the pool.

The time-consuming nature of PVD techniques such as electron beam physical vapor deposition (EB-PVD) necessitates improvements in productivity whenever possible. The rate at which coatings can be applied is critical in determining production cost, and depends on a variety of factors, such as the substrate temperature as the evaporated material is deposited thereon. (Elevated temperatures can enhance the coating rate, but sometimes degrade the strength of the substrate). Moreover, increasing the feed rate of ceramic material to the molten pool is desirable, but is limited by the need to prevent spattering of large droplets on the substrate. The spattering is due in part to bursting gas bubbles which evolve from the pool, as oxygen is released at elevated pool temperatures. In the case of a zirconia feed material, it is thought that most of the gas bubbles occur because the zirconia evaporates as the monoxide ZrO rather than the dioxide $ZrO_2$, allowing free oxygen to rise to the surface.

It's also important that the barrier layer be substantially free of defects, but this is sometimes difficult when the coating is formed and applied by a method such as EB-PVD. Coatings deposited in this manner are sometimes marred by chunks of non-homogeneous ceramic material embedded therein. During the service of the coated article, the chunks can separate from the coating, leaving pinholes. The pinholes allow hot gasses to penetrate, attacking the underlying bond coat and, ultimately, the metallic substrate. The life of the part is thus undesirably shortened. Adjustment of various parameters such as the electron beam intensity and heating pattern has alleviated the problem to some degree. However, unacceptable defects sometimes remain. Again, gas bubble formation in the molten pool appears to often be the root-source of the problem, since the bubbles lead to "spits", i.e., the ejection of particles from the pool and into the coating being formed on the substrate.

It's clear from the foregoing, as well as from a survey of the state of the art, that improvements in PVD processes for depositing barrier coatings like zirconium oxide onto a substrate would be of considerable interest in the industry. This is especially true when the substrate is a high-performance article like an aircraft engine part. These processes need to be more efficient than those of the prior art, by decreasing the number of defects which necessitate rejection of coated substrates. Moreover, it would be desirable that the processes increase the service life of the coated article. The processes should also not be unduly complex as compared to those of the prior art, and preferably won't require the use of new materials or significant amounts of additional equipment.

SUMMARY OF THE INVENTION

In view of the needs described above, the present discovery has been made. It is an improved method for depositing zirconium oxide from a zirconium oxide source onto a substrate by means of physical vapor deposition, herein PVD. The method comprises the step of adding zirconium metal to the zirconium oxide source, which is usually in the form of an ingot. The zirconium metal is present in an amount sufficient to chemically bond with a substantial portion of oxygen which would otherwise be freed from the oxide source, as both the zirconium metal and the zirconium oxide source are evaporated during physical vapor deposition (PVD). The invention is especially suited for electron beam physical vapor deposition techniques (EB-PVD), in which an electron beam is used to evaporate the zirconium metal and the zirconium oxide source during physical vapor deposition. In one embodiment, the zirconium metal comprises a tube which surrounds and contacts at least a portion of the outer surface of the ingot. In another embodiment, the zirconium metal is in the form of a rod inserted in a cavity within the ingot.

Yet another aspect of this invention is directed to an improved zirconium oxide source for the physical vapor deposition of zirconium oxide onto a substrate, comprising a mass of zirconium oxide adjacent to a mass of zirconium metal. The mass of zirconium oxide is often in the form of a cylindrical ingot, and the zirconium metal is usually in the form of a tube surrounding the ingot, or in the form of a rod inserted within the ingot. The amount of zirconium metal employed is determined as mentioned above and further described below.

Numerous other details regarding the present discoveries are provided below.

DETAILED DESCRIPTION OF THE INVENTION

Various types of PVD processes are known in the art, such as evaporation, ion plating, and sputtering. They are described, for example, in the Kirk-Othmer Encyclopedia of Chemical Technology, 3rd Edition, Vol. 10, pp. 250–258 (1980); Vol. 15, pp. 265–269 (1981); and Vol. 20, p. 42 (1982). Electron beam PVD (EB-PVD) is preferred for use in this invention. The selection of a particular EB-PVD system is not critical. Exemplary types and other relevant details are provided in U.S. Pat. Nos. 5,474,809; 5,419,971; and 5,418,003; all incorporated herein by reference.

Figure 1:
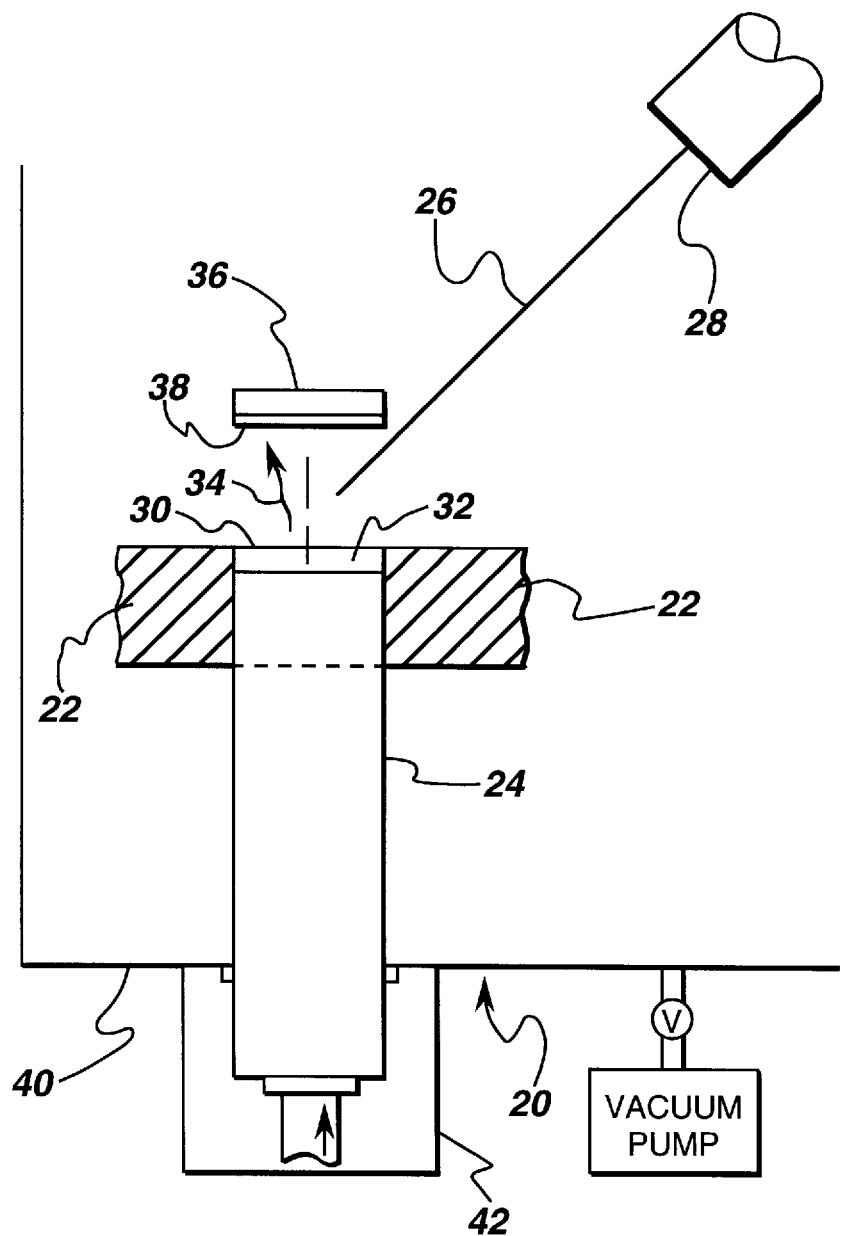
FIG. 1 is a schematic elevational view of a typical electron beam physical vapor deposition apparatus.

FIG. 1 illustrates one such EB-PVD apparatus 20, which is commercially available. Crucible 22 is in the form of a collar, and has sides and an open bottom. The crucible is representative of any containment device compatible with the ceramic material to be deposited (i.e. zirconium oxide), and capable of holding such a material in the molten or partially-molten state during evaporation. The crucible supports an ingot 24 of the ceramic material (i.e. zirconium oxide) which is to be melted and then deposited on substrate 36. The ingot is inserted vertically and upwardly into the bottom of the crucible. Although the shape of the ingot is usually cylindrical or substantially cylindrical, other shapes are also possible, and the shape of the crucible can easily be modified accordingly.

An electron beam 26 is produced by an electron beam gun 28, which is directed against an upper end 30 of the ingot. Other heat sources may be used instead of the electron beam, such as laser devices, induction heating coils, or resistance heaters, although the electron beam is usually preferred.

Substrate 36 may be any suitable material for depositing a thermal barrier coating. One such substrate material may be a metallic substrate or alloy, which is often a heat-resistant alloy. Many of these materials are referred to as "superalloys", and they typically have an operating temperature of up to about 1000°–11000° C. They are described in various references, such as U.S. Pat. Nos. 5,399,313 and 4,116,723, both incorporated herein by reference. High temperature alloys are also generally described in Kirk-Othmer's Encyclopedia of Chemical Technology, 3rd Edition, Vol. 12, pp. 417–479 (1980), and Vol. 15, pp. 787–800 (1981). Illustrative nickel-base superalloys are designated by the trade names Inconel, Nimonic, Rene (e.g., Rene 80, Rene 95), and Udimet. Other examples of superalloys are cobalt-base alloys and iron-base alloys. The type of substrate can vary widely, but it is often in the form of a jet engine part, such as the airfoil of a turbine blade. As another example, the substrate may be the piston head of a diesel engine, as well as any other surface requiring a heat-resistant barrier coating.

As described in the above-mentioned U.S. Pat. No. 5,419,971, a bond coat layer (not shown in FIG. 1) is often first applied to the substrate to promote adhesion between the substrate and the subsequently-applied thermal barrier coating (i.e. zirconium oxide coating). The bond coating usually has a thickness in the range of about 0.003 inch to about 0.008 inch, and can be made of any of the available materials judged suitable for this purpose, e.g., aluminides; MCrAlY coatings, wherein "M" can be various metals or combinations of metals, such as Fe, Ni, or Co; or nickel-base alloys having a composition different from that of the substrate. Exemplary bond coatings are described in U.S. Pat. No. 5,043,138, incorporated herein by reference. The bond coating may be applied by conventional techniques, e.g., any type of PVD, plasma spray, CVD, or combinations of plasma spray and CVD techniques. In the present description, "deposition on the substrate" should be construed to include the situation in which an intervening bond layer is present.

The substrate and various EB-PVD components are located in a vacuum chamber 40, which is usually maintained at a vacuum of about 0.005 millibar during the evaporation process (this vacuum level is also referred to as the "nominal background pressure" for the PVD system, and will be discussed later). Ingot 24 is usually placed into position prior to putting the chamber under vacuum. The base of the ingot is situated within ingot chamber 42. The ingot can be raised by any convenient mechanical technique as the upper end is melted. The substrate 36 is typically introduced into the chamber through an airlock (not shown). Various substrates can be introduced and withdrawn from the chamber without breaking the vacuum level.

With continued reference to FIG. 1, the intense heating of the ingot via electron beam gun 28 causes the ceramic at or near upper end 30 to melt, forming a molten pool 32. The material from the molten pool evaporates upwardly as an evaporated stream 34, which strikes the relatively cool substrate 36, condensing thereon to form ceramic coating 38. A translation mechanism (not shown) or similar elevating device raises the ingot in controlled fashion to replace the evaporated material in molten pool 32 with additional ceramic material, permitting deposition to be carried out in a continuous manner.

As mentioned above, the ceramic material used in this invention is zirconium oxide (i.e., zirconia, $ZrO_2$), a well-known compound described, for example, in Kirk-Othmer's Encyclopedia of Chemical Technology, 3rd Edition, V. 24, pp. 882–883 (1984). The use and characteristics of zirconium oxide in various evaporative processes is also described, for example, by 0. Unal et al in an article entitled *Microstructures of $Y_2O_3$-Stabilized $ZrO_2$ Electron Beam-Physical Vapor Deposition Coatings on Ni-Base Superalloys*, J. Am. Ceram. Soc. 77[4], 984–92 (1994). In preferred embodiments, the zirconium oxide is stabilized with another material, such as yttrium oxide (yttria), calcium oxide (calcia), scandium oxide (scandia), and magnesium oxide (magnesia). An illustrative composition of this type contains about 6% by weight to about 20% by weight yttrium oxide, with the balance being zirconium oxide.

The zirconium appears to evaporate from the molten pool as the monoxide, ZrO (according to Equation I, below), and as the dioxide, $ZrO_2$ (according to Equation II). The evaporation rate for the monoxide is higher than for the dioxide, thereby exhibiting higher deposition rates on the substrate. The monoxide typically recombines with oxygen to form the stable dioxide $ZrO_2$ on the surface of the substrate, as shown in Equation III.

$$2ZrO_2 \text{ (liquid)} \rightarrow 2ZrO \text{ (gas)} + O_2 \text{ (gas)} \qquad \text{(I)}$$

$$ZrO_2 \text{ (liquid)} \rightarrow ZrO_2 \text{ (gas)} \qquad \text{(II)}$$

$$2ZrO \text{ (solid)} + O_2 \text{ (gas)} \rightarrow 2ZrO_2 \text{ (solid)} \qquad \text{(III)}$$

The passage of the free oxygen (generated by the reaction of Equation I) through the molten pool as bursting gas bubbles causes the problems mentioned previously, e.g., spattering on the substrate. It is estimated that the release of oxygen from a 1.5 inch-diameter cylindrical ingot can result in the evolution of about 800 cc gas per minute (primarily oxygen), at atmospheric pressure.

It has been discovered that the troublesome gas evolution can be substantially reduced, and sometimes eliminated, by adding zirconium metal (i.e., the metal itself, containing no oxygen) to the zirconium oxide feed source. It appears that the zirconium metal takes up or "scavenges" the evolved gas, before it can leave the molten pool.

Figure 2:
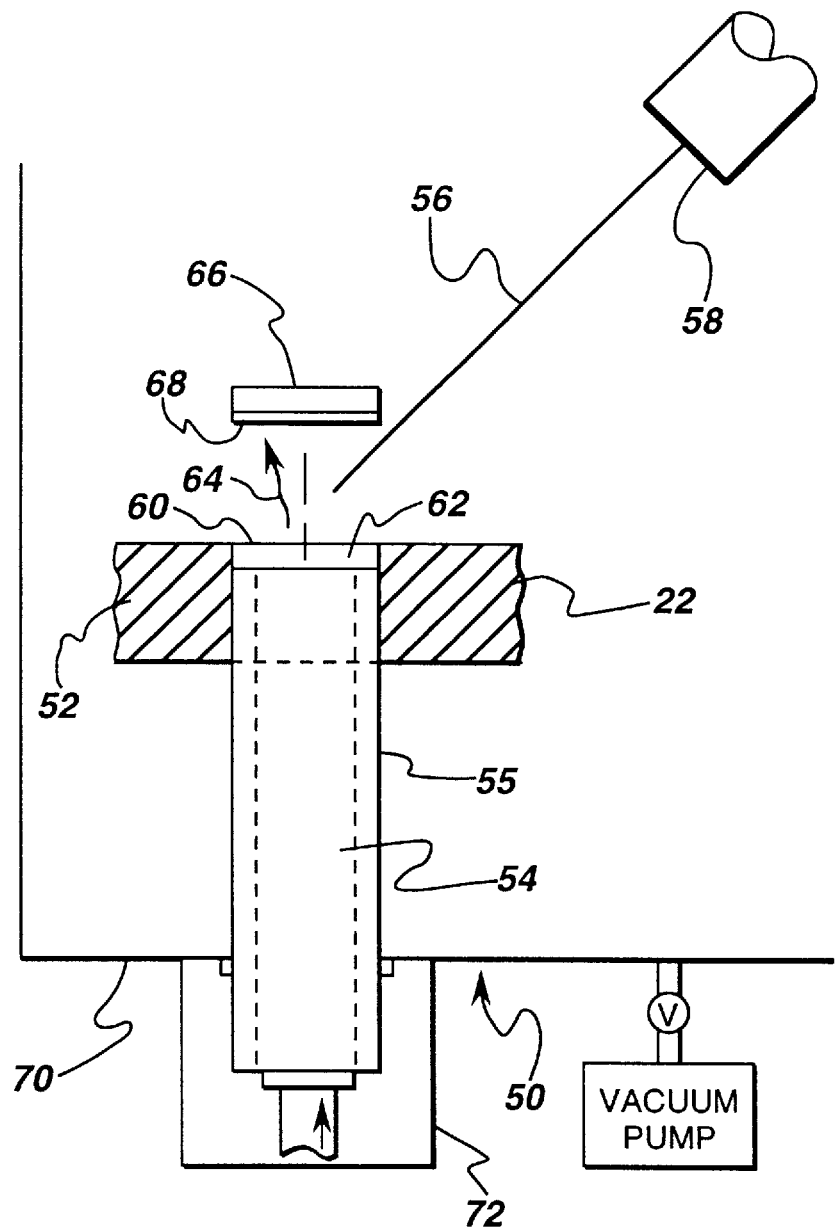
FIG. 2 is a schematic elevational view of an apparatus like that of FIG. 1, wherein the source material for the deposition is modified according to the present invention depicting an outer tube of zirconium metal surrounding and contacting the outer surface of the zirconium oxide ingot.

One technique for adding zirconium metal to the feed source according to the present invention is depicted in FIG. 2. Most of EB-PVD apparatus 50 and associated features depicted therein are identical to that of FIG. 1, including a crucible 52, electron beam 56, electron beam gun 58, molten pool 62 of zirconium oxide, evaporation stream 64, substrate 66, ceramic coating 68, vacuum chamber 70, and ingot chamber 72. In this embodiment, an outer tube 55 of zirconium metal surrounds the core of zirconium oxide, i.e., ingot 54. The zirconium metal tube is melted with the zirconium oxide inner core as the zirconium oxide ingot is raised and exposed to the heat source. The method of attaching the zirconium metal tube 55 to the ingot core 54 is not critical to the present invention. The tube could be rolled and then wrapped tightly around the core. The tube could also be obtained in the shape of a foil, and wrapped many times around the core. Alternatively, the tube could be pre-formed, and the ingot core could then be inserted tightly into the tube, friction-fitting to its inner surface. Although tube 55 is depicted as concentric around the ingot core 54, it does not have to completely surround the core to be effective. The zirconium metal may contact the zirconium oxide core ingot or it may be in close enough proximity to the ingot so as to melt and scavenge the evolved oxygen before the oxygen leaves the molten pool.

In general, the amount of zirconium metal used in the tube is determined by the stoichiometry of the reaction which results in the molten pool-composition being primarily zirconium monoxide, rather than zirconium dioxide, i.e., according to the equation $$Zr + ZrO_2 \rightarrow 2ZrO \qquad \text{(IV)}.$$

The theoretical amount of additional zirconium metal needed to react with all of the evolving oxygen can be calculated. In practice, the ratio of the necessary amount of zirconium metal to the molecular weight of zirconium (91) will be equal to the ratio of zirconium dioxide already present (i.e., the ingot or other source) to the molecular weight of zirconium dioxide (123). Thus, for a given size of ingot, the appropriate amount of zirconium metal can be calculated. This amount of material can then be shaped into a tube, using standard dimension-calculations for the surface area and volume of a tube having a given length and wall thickness.

Since some of the zirconium will probably evaporate as the dioxide, i.e., taking two atoms of oxygen for every atom of metal, there may be an excess of zirconium evaporating and condensing on the substrate. The presence of the additional zirconium metal would usually have the effect of promoting the deposition of zirconium monoxide on the substrate. However, since zirconium dioxide is the more useful thermal barrier coating material, steps should be taken to ensure that it is the dominant material being deposited on the substrate. The addition of oxygen serves this purpose, converting substantially all of the monoxide to dioxide. Oxygen may be added by any conventional technique from an external source to the vacuum chamber (e.g., through a separate valve into the chamber), during the melting and deposition process. The theoretical amount of additional oxygen which would be required to bond with the additional zirconium metal to form zirconium dioxide on the surface of the substrate can be calculated, based on the amount of zirconium metal utilized, and taking into account the various sources of oxygen evolution.

In practice, though, the most efficient technique for determining the proper amount of additional oxygen is by monitoring the pressure level in the vapor deposition chamber, relative to the nominal background pressure value mentioned above (i.e., the typical background pressure utilized, in the absence of zirconium metal addition according to this invention.). Thus, if the pressure of the system is below the background pressure value, the oxygen flow can be increased to bring the pressure up to that value. Conversely, if the system pressure is above the background pressure level, the oxygen flow can be decreased or stopped entirely.

Figure 3:
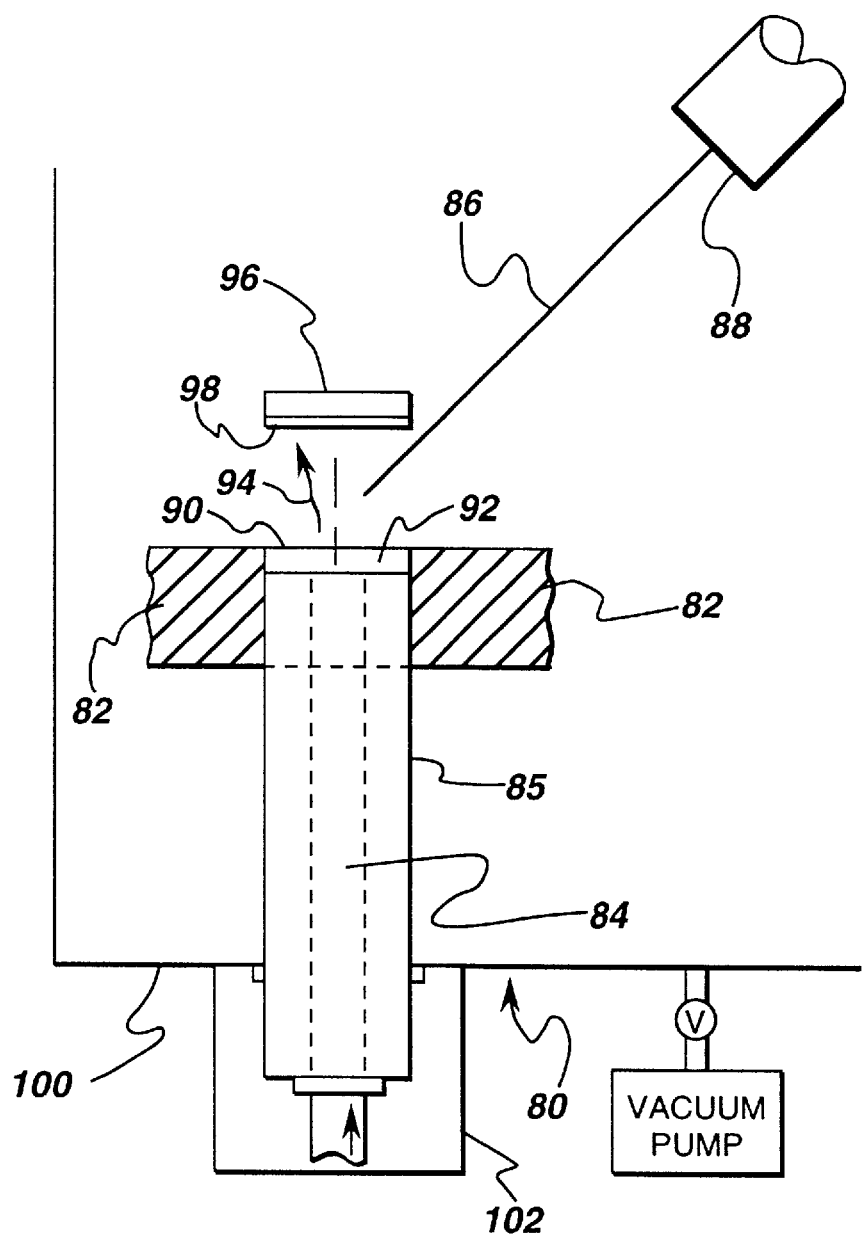
FIG. 3 is a schematic elevational view of an apparatus like that of FIG. 2, wherein the source material for the deposition is modified according to another embodiment of the present invention so that an inner core or rod of zirconium metal is fitted within the zirconium oxide ingot.

In another embodiment of this invention, the zirconium oxide source can again be in the form of an ingot, but the additional zirconium metal being added is in the form of a rod which is inserted into a cavity within the ingot. With reference to FIG. 3, most of EB-PVD apparatus 80 and associated features depicted therein are identical to that of FIG. 1, including a crucible 82, electron beam 86, electron beam gun 88, molten pool 92 of zirconium oxide, evaporation stream 94, substrate 96, ceramic coating 98, vacuum chamber 100, and ingot chamber 102. In this embodiment, a bore is first formed in zirconium oxide ingot 85 by any conventional technique, such as drilling. The rod 84 of zirconium metal is then placed inside the bore. The rod can be manually inserted into the bore and dimensioned to fit snugly therein, or it can be mechanically fastened inside the bore, e.g., by fasteners.

The shape of the rod is not critical to this invention, although it is conveniently made in the form of a solid cylinder having a height similar to that of the ingot. Thus, proportionate amounts of zirconium metal and zirconium oxide would be exposed to the electron beam during the EB-PVD operation. The appropriate amount of zirconium metal to be used can be approximated by the technique set forth above. In this instance, the decrease in total amount of zirconium oxide available in the form of the ingot (i.e., due to the cavity formed in the ingot) is also taken into account. The theoretical amount of additional zirconium metal required is calculated, and this amount of metal is shaped into a rod, again using standard dimension-calculations for the surface area and volume of the rod.

The appropriate amount of additional oxygen for bonding to the additional zirconium metal to form primarily zirconium dioxide on the surface of the substrate can again be determined by reference to the nominal background pressure level, as described previously. Any additional oxygen can be conventionally metered in during the melting and deposition process.

While the description provided above is generally directed at the use of an "ingot" of zirconium oxide, other sources of such a material, which are known in the art, could alternatively be used. As an example, the zirconium oxide could be in the form of beads, powder, grains, or flakes, situated in an appropriate container within the vacuum chamber. The container could rotate or spin on an axis within the general area occupied by the crucible in the figures. The rotation would allow equal portions of the zirconium oxide medium to be exposed to the electron beam or other heat source, and then melted/evaporated as described previously.

In this embodiment, the zirconium metal could be utilized in similar form, e.g., in the form of grains or beads. (Well-known precautions would have to be taken if the zirconium were in more combustible or explosive forms, such as powder or flakes). The zirconium metal could be pre-mixed with the zirconium oxide. Alternatively, each component could be added simultaneously to the container from two separate sources, in the appropriate ratio. The relative amounts of zirconium metal and zirconium oxide would be calculated as mentioned previously.

Another aspect of the present invention is directed to an improved zirconium oxide source for the physical vapor deposition of zirconium oxide onto a substrate, e.g., by EB-PVD. As described previously, the source comprises a mass of zirconium oxide adjacent to a mass of zirconium metal. The zirconium oxide mass is usually in the form of an ingot, and the pure zirconium metal can be in the form of a rod inserted in a cavity within the ingot, or can be in the form of a tube which surrounds and contacts at least a portion of the outer surface of the ingot. As described previously, the coating material evaporates from a molten pool formed by heating the upper portion of the ingot. The ratio of zirconium metal to zirconium oxide is sufficient to substantially reduce or prevent the formation of gas bubbles in the molten pool.

EXAMPLE

The following example is provided by way of illustration, and not by way of limitation. The desirable effect of utilizing the present invention was experimentally verified with test samples. Button samples having a diameter of about 1 inch and a thickness of about ⅛ inch were prepared from a solidified, nickel-base superalloy designated as Rene N4. A platinum/aluminide bond coating was applied to the specimens, to a depth of about 0.002 to 0.003 inches, using the well-known pack codeposition process.

A cylindrical, zirconium oxide ($ZrO_2$) ingot having a length of about 8 inches and an outside diameter of about 2.5 inches was used for this experiment. The zirconium oxide was stabilized with about 7% by weight yttria. A 1 inch-diameter hole was bored substantially in the center of the ingot, and a rod of pure zirconium metal, having the approximate dimensions of the cavity, was inserted therein, so that its top end was substantially flush with the upper surface of the ingot.

An EB-PVD apparatus similar to that described in U.S. Pat. No. 5,418,003 was used to apply the zirconium oxide coating on the surface of a button, which was positioned about 15 inches above the copper crucible used to hold the ingot. After the modified ingot was inserted into the crucible, the electron beam was directed at the upper end of the ingot, bringing that portion to a temperature sufficient to form a molten pool of zirconium-containing, ceramic material, and to cause evaporation to begin at a commercially-acceptable rate. The ceramic material from the molten pool evaporated upwardly to the bond-coated surface of the button, and condensed thereon, to an average thickness of about 0.005 inch to about 0.012 inch.

The button specimen was then placed in a thermal cycling apparatus, which would subject it to periodic heating and cooling cycles. In each cycle, the button was heated to a temperature of 2075° F. (1135° C.) in 10 minutes, held at that temperature for 45 minutes, and then cooled down below about 300° F. (149° C.) in 10 minutes. The specimen was examined every 20 cycles. Failure was defined as the number of cycles required before 20% of the surface of the specimen had lost its thermal barrier coating by spallation (i.e., coating cracks which lead to flaking or chipping-away of the coating). Multiple samples were coated and tested in this manner, and the results represent the average for those samples. A button which had previously been coated in substantially the same manner by EB-PVD using only a zirconium oxide ingot was used as the control. The zirconium oxide used to coat the control button did not include the pure zirconium metal component used for the present invention.

The control sample exhibited an average cycle-to-failure value of 573 cycles, while the samples of the present invention exhibited an average value of 755 cycles. These results clearly demonstrate a highly-improved resistance to spallation failure, and improved adhesion. Thus, barrier coatings on critical substrates such as turbine blades exhibit a longer service life than barrier coatings produced by prior art processes.

The molten pool formed from the ingot modified according to this invention was significantly smoother and more stable than the pools formed without such modification, due to greatly-reduced bubble formation. Moreover, the "spitting" or growth of agglomerates above the pool was substantially eliminated, in contrast to what was observed in the absence of using zirconium metal. Additionally, much greater feed rates (i.e., elevation rates) for the ingot can be utilized, because the complications resulting from gas evolution and bubble formation have been substantially eliminated. Thus, higher coating rates are possible, leading to greater process efficiency. Furthermore, the barrier coatings formed by this invention exhibited a high degree of microstructure-uniformity.

While preferred embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

All of the patents, articles, and texts mentioned above are incorporated herein by reference.

What is claimed:

1. An improved method for depositing zirconium oxide from a zirconium oxide source onto a substrate by means of physical vapor deposition, comprising the step of adding zirconium metal to the zirconium oxide source by further using the zirconium metal as an evaporation source adjacent to the zirconium oxide source.

2. The method of claim 1, wherein the zirconium oxide source is in the form of an ingot, and the zirconium metal comprises a tube which surrounds and contacts at least a portion of the outer surface of the ingot.

3. The method of claim 1, wherein the zirconium metal is present in an amount sufficient to chemically bond with a substantial portion of oxygen which would otherwise be freed from the oxide source, as both the zirconium metal and the zirconium oxide source are evaporated during physical vapor deposition.

4. The method of claim 1, wherein an electron beam is used to evaporate the zirconium metal and the zirconium oxide source during physical vapor deposition.

5. The method of claim 1, wherein the zirconium oxide source is in the form of an ingot, and the zirconium metal comprises a rod inserted in a cavity within the ingot.

6. The method of claim 1, wherein the zirconium oxide source is in a form selected from the group consisting of beads, powder, grains, and flakes.

7. The method of claim 6, wherein the zirconium metal is in the form of grains or beads.

8. The method of claim 1, wherein the physical vapor deposition is carried out in a vacuum chamber operating at a vacuum of about 0.005 millibar, and oxygen is added to the chamber during deposition to substantially maintain the pressure value.

9. The method of claim 1, wherein the substrate is made of a material comprising a superalloy.

10. The method of claim 9, wherein the superalloy is nickel-based.

11. The method of claim 1, wherein the substrate is a component of a turbine engine.

12. The method of claim 1 where the substrate has a bond coat layer first applied to the substrate to improve adhesion of subsequently applied zirconium oxide on the substrate.

13. The method of claim 12 where the bond coat is an aluminide or a nickel-base alloy different from the substrate or a MCrAlY coating, where M is selected from the group consisting of Fe, Ni, Co, and mixtures thereof.

14. The method of claim 1 where the zirconium oxide source is chemically stabilized by a material selected from the group consisting of yttrium oxide, calcium oxide, magnesium oxide, scandium oxide, and mixtures thereof.

15. A method for depositing evaporated zirconium oxide coatings onto a substrate, using a physical vapor deposition apparatus, comprising the steps of:

(a.) adding zirconium metal to an ingot of a zirconium oxide source material by using the zirconium metal as an evaporation source adjacent to the zirconium oxide source so that proportionate amounts of the metal and the oxide is exposed to an intense heat source which constitutes part of the apparatus;

(b.) evaporating a portion of the zirconium oxide source and zirconium metal by melting the surface of the ingot with the heat source, thereby forming a molten pool surrounding the ingot; and (c.) depositing the evaporated material onto the substrate as a coating, wherein the ratio of zirconium metal to zirconium oxide source material is substantially maintained in a pre-selected proportion sufficient to substantially reduce or prevent the formation of gas bubbles in the molten pool.

16. The method of claim 15, wherein the intense heat source is an electron beam.

17. The method of claim 15, wherein the physical vapor deposition is carried out in a vacuum chamber operating at a vacuum of about 0.005 millibar, and oxygen is added to the chamber during deposition to substantially maintain the pressure value.

18. The method of claim 15, wherein the zirconium oxide source is in the form of a substantially cylindrical ingot, and the zirconium metal comprises a tube which surrounds and contacts at least a portion of the outer surface of the ingot.

19. The method of claim 15, wherein the zirconium oxide source is in the form of a substantially cylindrical ingot, and the zirconium metal comprises a rod inserted in a cavity within the ingot.

20. The method of claim 15, wherein the substrate is made of a material comprising a superalloy.

* * * * *